United States Patent [19]

Schwartz

[11] Patent Number: 4,920,343

[45] Date of Patent: Apr. 24, 1990

[54] CAPACITIVE KEYSWITCH MEMBRANE WITH SELF CONTAINED SENSE-TO-GROUND CAPACITANCE

[75] Inventor: Kenneth E. Schwartz, El Paso, Tex.

[73] Assignee: Honeywell Inc., Minneapolis, Minn.

[21] Appl. No.: 252,228

[22] Filed: Sep. 30, 1988

[51] Int. Cl.⁵ ................... H03M 11/00; H03M 17/98
[52] U.S. Cl. ..................................... 341/33; 200/5 A; 200/600; 400/479.1; 341/22
[58] Field of Search ................... 341/33, 34, 26, 22; 340/825.79; 200/5 A, 5 R, 600, 511, 512, 292; 400/479, 479.1, 491, 491.1; 178/17 C, 17 D; 361/277, 278, 280, 281, 287, 288, 290, 291

[56] References Cited

U.S. PATENT DOCUMENTS

| | | | |
|---|---|---|---|
| 4,616,213 | 10/1986 | Danish | 341/26 |
| 4,728,931 | 3/1988 | Linder et al. | 341/33 |
| 4,743,895 | 5/1988 | Alexander | 341/33 |

Primary Examiner—Donald J. Yusko
Assistant Examiner—Tyrone Queen
Attorney, Agent, or Firm—Charles L. Rubow

[57] ABSTRACT

A membrane capacitive keyboard of the type including a first flexible dielectric sheet and a second dielectric sheet having electrically conductive patterns thereon which form an array of capacitors and connecting matrices of drive and sense conductors. The patterns on the sheets include a first array of capacitor plates on an inner surface of the first sheet and a second array of capacitor plates on the outer surface of the second sheet. A third array of electrically floating capacitor plates is formed by a third pattern on the inner surface of the second sheet. The sense conductors are capacitively coupled to ground through coupling capacitor plates connected to the sense conductors and a common capacitor plate overlaying the coupling capacitor plates.

7 Claims, 3 Drawing Sheets

CAPACITIVE KEYSWITCH MEMBRANE WITH SELF CONTAINED SENSE-TO-GROUND CAPACITANCE

BACKGROUND OF THE INVENTION

The invention disclosed herein relates generally to capacitive keyboard systems, and more particularly to low cost membrane capacitive key switch systems in which sense node to ground capacitance required for detector operation is provided without the requirement for a discrete conductive ground plane.

Capacitive keyboards are well known in the field of data input devices for information handling and data processing systems. They provide certain inherent advantages over electrical contact keyboards. The advantages particularly include mechanical simplicity, long life and absence of electrical signal problems caused by contact bounce and corrosion. Keyboards using capacitive key switches also facilitate the provision of N-key roll over which permits proper detection of key switch actuations in the presence of multiple switches remaining actuated during the same time period.

In order to reduce the cost and complexity of detection circuitry used with capacitive keyboards, and in order to reduce the number of conductors necessary to connect such keyboard with external detection circuitry, it is known to provide for sequential scanning of key actuated capacitors to determine key status. This may be accomplished by means of a matrix of row and column conductors, each key actuated capacitor being connected between a unique pair of conductors comprising one row and one column conductor. A drive signal may be sequentially impressed on the conductors in one set of conductors while the conductors in the other set are sequentially addressed to detect signals coupled thereto.

There is, however, a problem with scanned capacitive key switch systems which stems from the fact that there is inherent capacitive coupling between every pair of elements in a keyboard. Thus, in a typical capacitive keyboard having a matrix of conductors including drive signal and sense signal conductors, a signal on any conductor will normally appear to some extent on every other conductor. Obviously, this phenomenon complicates the task of detecting which of an array of variable capacitors between pairs of conductors in the matrix is actuated.

Various capacitance detection schemes have been devised for satisfactorily dealing with the above described detection problem. One such detector circuit is described in detail in U.S. Pat. No. 4,728,931 issued to W.J. Linder, et al. on Mar. 1, 1988 and assigned to the assignee of the present application. Satisfactory implementation of this detector circuit, as well as most somewhat similar circuits, depends on careful balancing of the actuated and unactuated key switch capacitances, the sense node to ground capacitance and the capacitance value of a reference capacitor in the detector circuit.

As apparent from the above identified patent, the detector circuit disclosed therein is well suited for fabrication as an integrated circuit using standard CMOS integrated circuit designs which provide for low power consumption and low cost. Such designs are sensitive to input signal voltage parameters. In particular, input signal voltages less than the circuit reference voltage by more than a predetermined amount may cause latch-up and destruction of the circuit. In prior capacitive keyboard designs using metal housings and other components which furnished a conductive backplane, the sense node to ground capacitance provided inherent protection against excessively negative sense node voltages.

More recent keyboard designs directed at high volume keyboard markets which have become increasingly cost competitive have tended away from metal components and toward all plastic construction. This greatly reduces the sense node to ground capacitance and the control it provided over excessively negative input signal voltages. It is apparent that the sense node to ground capacitance could be reintroduced by adding a metallized membrane backplane or equivalent elements. However, the addition of parts is undesirable from manufacturing cost considerations.

The applicant has devised a unique membrane capacitive keyboard design which retains the advantages of prior membrane capacitive keyboards and detector circuit designs while eliminating the need for metal housings or backplanes and without introducing additional parts or manufacturing steps.

SUMMARY OF THE INVENTION

The present invention is a membrane capacitive keyboard design and capacitive keyboard system in which a first flexible dielectric sheet has a first electrically conductive pattern on a first surface thereof, the pattern forming an array of first capacitor plates and a plurality of drive conductors connecting the first capacitor plates in groups with each plate connected to only one drive conductor, and a second dielectric sheet having second and third electrically conductive patterns on opposite surfaces thereof, the second conductive pattern on one surface forming an array of capacitor plates having the same spacing and arrangement as the array of first capacitor plates and a plurality of sense conductors connecting the second capacitor plates in groups, with each capacitor plate connected to only one sense conductor. The other surface of the second sheet has the third conductive pattern thereon which forms an array of third capacitor plates spaced and arranged to overlay the second capacitor plates, the third capacitor plates being electrically isolated from one another. The second conductive pattern also includes a coupling capacitor plate electrically connected to each of the plurality of sense conductors, the coupling capacitor plates being laterally separated from the second capacitor plates. The third conductive pattern includes capacitor plate means of which portions overlay each of the coupling capacitor plates so as to provide capacitive coupling between sense conductors.

The foregoing membrane capacitive keyboard may be connected in a system with capacitance detector means having a plurality of output terminals connected to the drive conductors and operable to supply drive signals to the drive conductors sequentially. The capacitance detector means may also include a plurality of input terminals connected to the sense conductors for receiving signals coupled thereto from the drive conductors, the detector means being of the type which sequentially addresses the sense conductors while maintaining all sense conductors, except the one addressed, at ground potential.

DESCRIPTION OF THE PREFERRED EMBODIMENT

Figure 1:
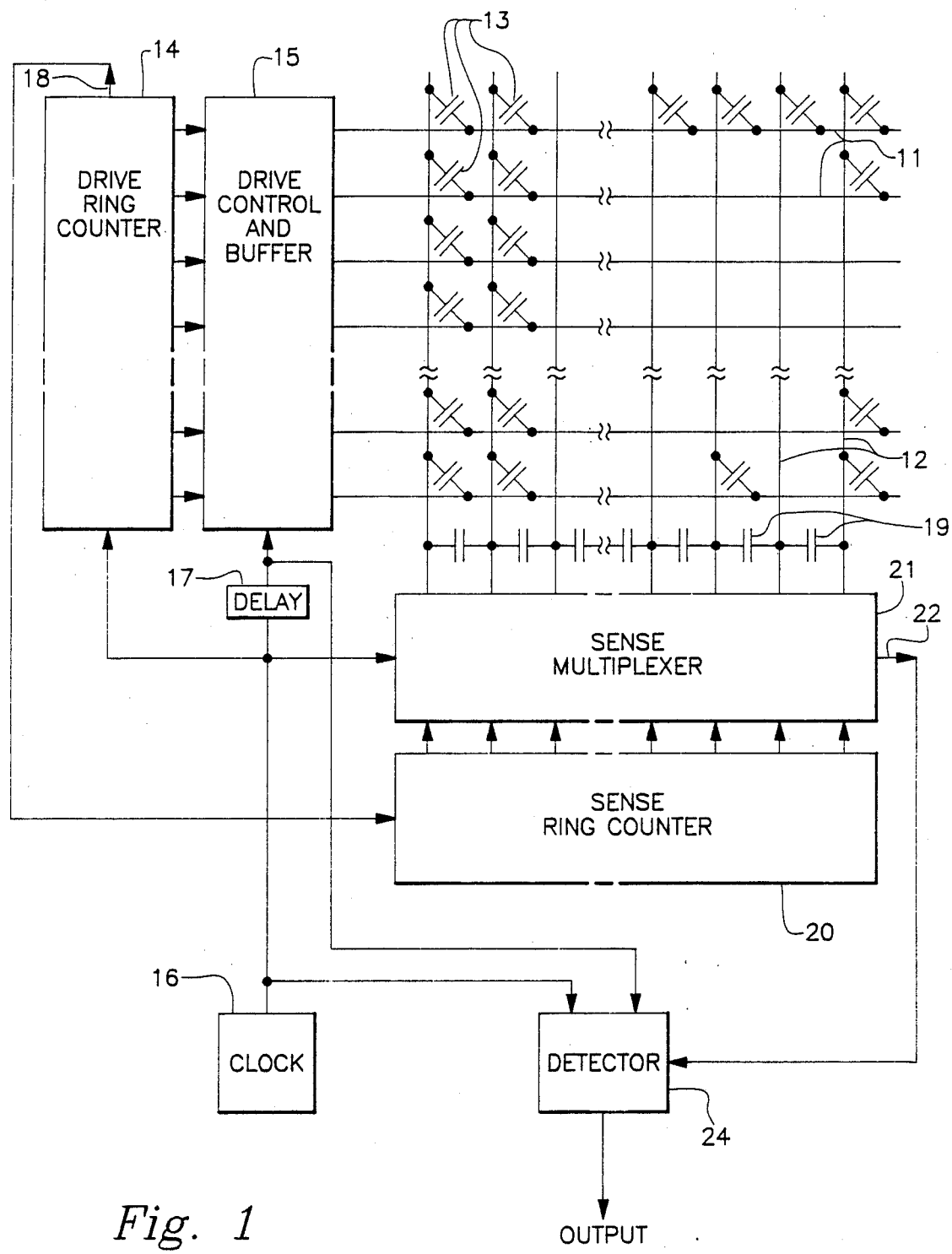
FIG. 1 is a general schematic block diagram of a capacitive keyboard system in accordance with the present invention.

Schematically illustrated in FIG. 1 is a matrix of capacitive keyboard conductors. The matrix includes a first set or plurality of conductors 11 to which drive pulses are supplied and a second set or plurality of conductors 12 on which signals are sensed. Although a particular matrix is shown, the size or configuration of the matrix is not important to the applicant's invention. Also, although the conductors are represented by sets of parallel, horizontal and vertical lines for illustrative purposes, conductors in an actual keyboard matrix may follow a considerably more complex and irregular pattern as apparent from FIG. 3 discussed hereinafter.

As illustrated in FIG. 1, a capacitor 13 is located at each crossing of conductors in the first and second sets. Capacitors 13 are key actuable variable capacitors, each having a fixed plate and a movable plate, and may be referred to as capacitive switches. One of the plates of each capacitor 13 is connected to one of conductors 11. The other plate of each capacitor 13 is connected to one of conductors 12. Accordingly, each capacitor 13 provides variable capacitive coupling between a unique pair of conductors comprising one conductor from each set of conductors.

Conductors 11 are sequentially supplied with a drive signal by scanning means including a drive ring counter 14 and a drive control and buffer 15. The output terminals of drive control 15 connected to conductors 11 are normally at a logical low state, and are individually driven to a logical high state in sequence under the control of counter 14. Counter 14 as well as various other portions of the apparatus are advanced at a rate determined by a system clock 16. Operation of drive control 15 is delayed slightly from other clock synchronized system operations. Delayed operation is accomplished in part by receipt of clock pulses through delay circuitry 17.

After driver ring counter 14 has advanced through a complete scan of drive lines 11, it produces a signal on a terminal 1B which is supplied to a sense ring counter 20. Counter 20 controls a sense multiplexer 21 which sequentially addresses conductors 12 so that the signal on each conductor is transmitted, in turn, through a multiplexer output terminal 22 to a detector 24. As will be described in greater detail in connection with FIG. 2, sense multiplexer 21 also maintains conductors 12 at the system reference potential except for individual conductors while they are being addressed. Thus, inactive sense conductors 12 are maintained at electrical ground.

Figures 2, 4:
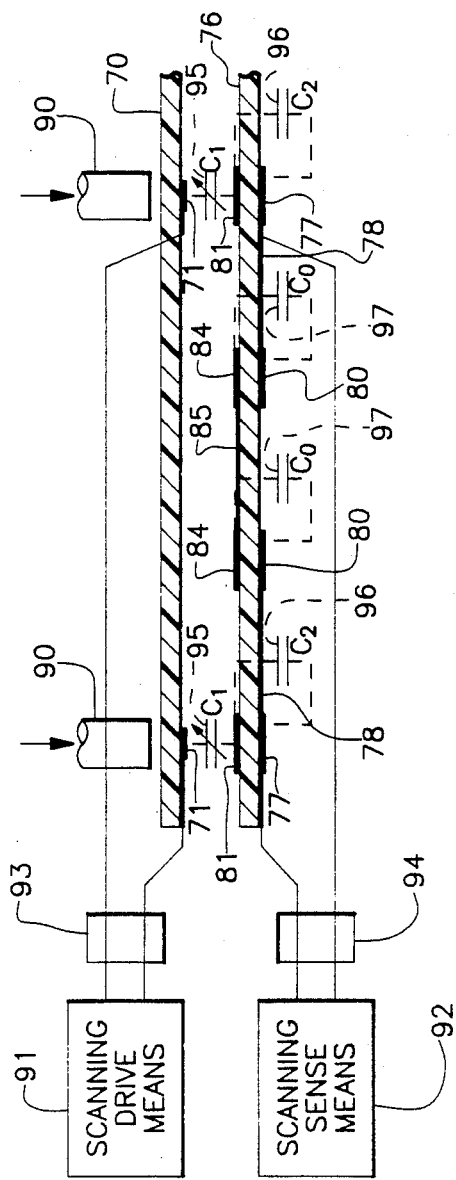
FIG. 2 is a schematic circuit diagram of a preferred embodiment of a detector circuit for use in the system of FIG. 1.
FIG. 4 is a cross sectional schematic representation of a portion of the capacitive key switch membrane of FIG. 3 with scanning drive means and scanning sense means connected thereto.

Reference numeral 24, as shown in greater detail in FIG. 2, identifies a detector having a sense terminal connected to output terminal 22 of sense multiplexer 21. Detector 24 also receives undelayed and delayed clock signals from clock 16 and delay device 17 respectively.

Capacitance from sense node to ground required for proper operation of a capacitance detector is provided through coupling capacitors 19 which, in FIG. 1, are shown connected between sense conductors 12. As shown in greater detail in FIG. 3, each sense conductor 78 has a coupling capacitor plate connected thereto which cooperates with a common capacitor plate to provide the necessary capacitive coupling to ground.

In FIG. 2, the dashed line block identified by reference numeral 30 is the equivalent circuit of one of capacitors 13 and its associated conductors 11 and 12 in FIG. 1. Equivalent circuit 30 includes a variable capacitor 31 which represents one of the capacitive key switches in the keyboard array. Equivalent circuit 30 is shown connected between a source of delayed clock signals 32 and a sense multiplexer input terminal identified by reference numeral 33. The delayed clock signals at source 32 may be provided by system clock 16 and delay circuitry 17 shown in FIG. 1.

A capacitor 34 shown connected between one plate of capacitor 31 and ground represents the effective shunt capacitance between the drive conductor to which capacitor 31 is connected and ground. Similarly, a capacitor 35 shown connected between the other plate of capacitor 31 and ground represents the shunt or parasitic capacitance associated with the sense conductor to which capacitor 31 is connected.

The capacitance represented by capacitor 34 can be ignored since it is assumed that the drive circuitry has sufficient output capacity to establish whatever drive voltage is required on the drive conductors. However, the capacitance represented by capacitor 35 may have a substantial effect on signals coupled to the sense conductors and the operation of detection circuitry for sensing the states of the capacitive switches.

Specifically, the capacitance represented by capacitor 35 limits the magnitude of the positive or negative excursions of the sense voltage by a factor depending on the ratio of its value to that of capacitor 31. If capacitor 35 has a capacitance which is too small, the excursions of the sense voltage increase, possibly to the point of destruction of the detection circuitry due to latch-up if the voltage becomes too negative. Conversely, too high a capacitance for capacitor 35 limits the change in sense voltage to the point that not enough difference exists to be detected by the detection circuitry.

In prior keyboard designs employing metal housings and/or other metal components, a suitable value for capacitor 35 could be achieved by inherent capacitive coupling between the various conductors and the grounded metal parts. However, this capacitive coupling is lost in newer keyboard designs which make maximum use of plastic for housings and other parts. In the arrangement devised by the applicant, a substantial part of the necessary capacitance value of capacitor 35 is provided by coupling capacitors 19 which, as set forth hereinafter, may be implemented without adding any discrete parts or additional manufacturing steps.

In FIG. 2, reference numeral 36 identifies one of a plurality of switching elements in sense multiplexer 21. A first plate of capacitor 31 is selectively connected through multiplexer input terminal 33 and switching element 36 to a sense node 38 to which a first plate of a reference capacitor 40 is also connected. Reference capacitor 40 has a capacitance between the minimum and maximum capacitances of capacitor 31.

Reference capacitor 40 receives a drive signal which comprises a further delayed and inverted version of the delayed clock signal at delayed clock source 32. The further delay is achieved by a series connected pair of inverters 41 and a capacitor 42. Signal inversion is accomplished by a further inverter 43 whose input terminal is connected to the junction between inverters 41 and capacitor 42. Inverters 41 and capacitor 42 simulate the signal delay inherent in the keyboard capacitive switch array as a result of the capacitances identified in equivalent circuit 30. This provides that voltage changes across sense capacitor 31 and reference capacitor 40 are subject to substantially identical delays to achieve a charge redistribution which accurately represents the relative capacitance values.

Reference numeral 50 identifies a comparator having inverting and noninverting input terminals 51 and 52 respectively and an output terminal 53 at which is produced a signal indicative of whether the voltage at inverting input terminal 51 is smaller or larger than the voltage at noninverting input terminal 52, the latter voltage being system ground. Input terminal 51 is selectively connected to sense node 38 through a switching device 54. Switching device 54 is controlled in response to the clock signal, subject to a constraint that any complete period of the clock signal not exceed a predetermined duration. Input terminal 51 is also selectively connected to system ground through a switching device 55 which is controlled by the clock signal in an out of phase relationship with operation of switching device 54.

The clock signal is supplied by a clock signal source 56 which corresponds to system clock 16 in FIG. 1. The clock signal is supplied through an inverter 57 to a time-out circuit 58 whose output signal is supplied to a first input terminal of a NAND circuit 59. A second input terminal of NAND circuit 59 receives the clock signal directly from source 56. Accordingly, as long as the high phase of the clock signal does not exceed a predetermined duration fixed by time-out circuit 58, the output signal of NAND circuit 59 replicates the clock signal.

The output signal of NAND circuit 59 is supplied directly to the control terminal of switching device 54, and through an inverter 60 to the control terminal of switching device 55. During normal operation, the low phase of the clock causes switching device 55 to conduct, thereby connecting inverting input terminal 51 to system ground, and electrically isolating terminal 51 from sense node 38. Sense node 38 is also connected to system ground during this clock phase through switching devices in sense multiplexer 21. Yet further, during this clock phase the plates of sense capacitor 31 and reference capacitor 40 not connected to sense node 38 are respectively charged to system ground and a drive voltage different from system ground respectively.

Conversely, during the high phase of the clock, input terminal 51 is isolated from system ground and connected to sense node 38 which is also isolated from system ground. At the same time, the drive voltages on the second plates of sense capacitor 31 and reference capacitor 40 are reversed. This results in a charge redistribution on the first plates of the sense and reference capacitors and a change in the voltage on sense node 38 whose polarity depends on whether the capacitance of the sense capacitor is smaller or larger than that of the reference capacitor. The voltage at sense node 38 is compared with a reference voltage (system ground) by comparator 50 which, in turn, produces an output signal indicative of the stat of the capacitive key switch then being addressed.

The output signal of comparator 50 is indicative of the state of the capacitive key switch being addressed only during the high phase of the clock. This signal is preserved and transmitted during the next succeeding low phase of the clock by a latching circuit 62 connected to output terminal 53 of comparator 50 through a transmission gate 63. During the high phase of the clock signal, gate 63 is operable to connect comparator output terminal 53 to latching circuit 62, which is effectively transparent during that clock phase and replicates the comparator output signal at detector output terminal 64. During the low clock phase, gate 63 isolates latching circuit 62 from comparator output terminal 53, and circuit 62 continues to produce an output signal corresponding to the comparator output signal during the last preceding high clock phase. In the event that the high clock phase exceeds the duration established by time-out circuit 58, latching circuit 62 is provided with the same control signals as during the low clock signal phase, thereby causing it to continue to produce an output signal corresponding to the comparator output signal during the last valid portion of the high clock phase.

Figure 3:
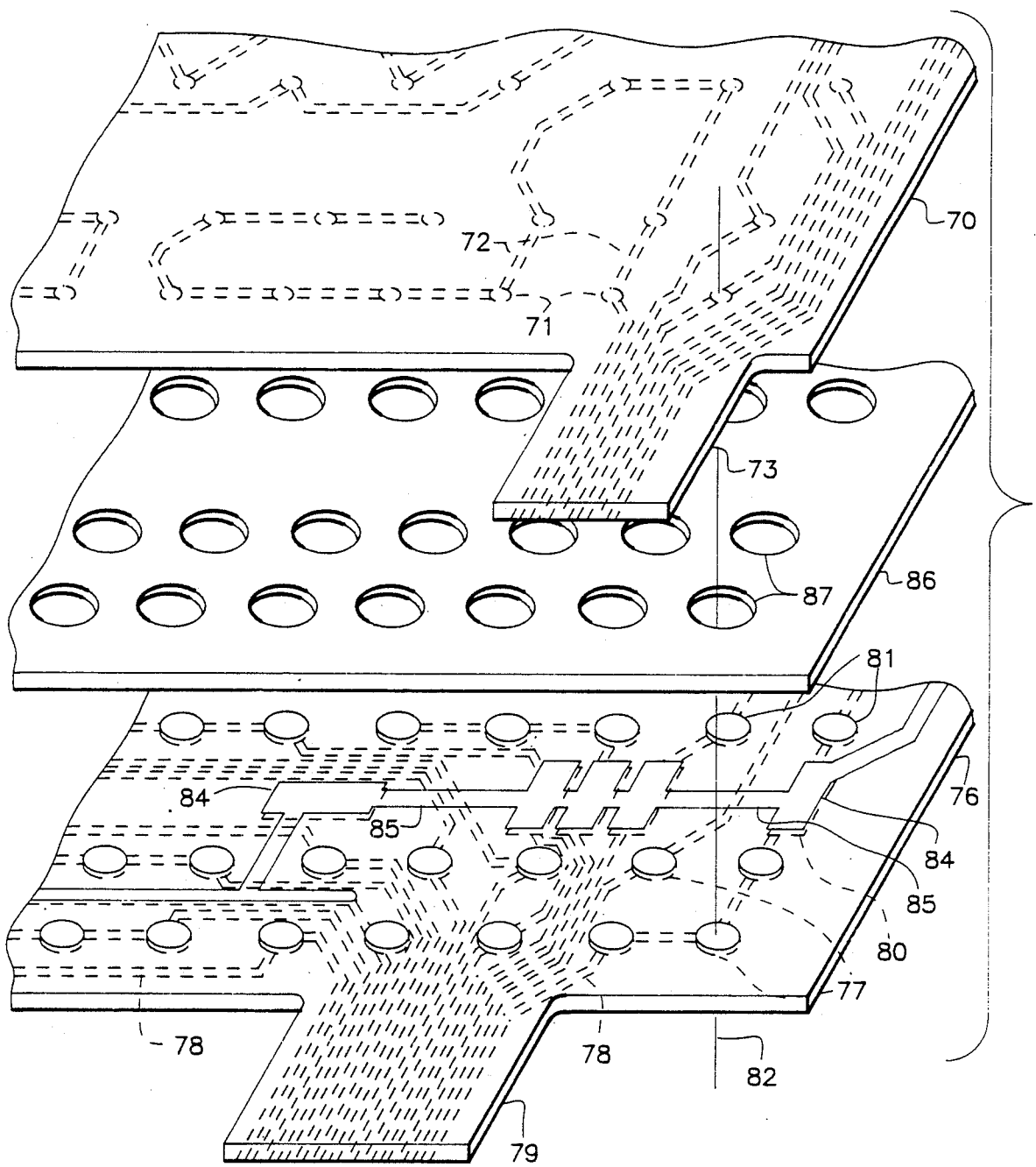
FIG. 3 is a partial exploded view of a capacitive key switch membrane assembly in accordance with the applicant's invention.

In the capacitance switch membrane of FIG. 3, reference numeral 70 identifies a flexible substrate or dielectric sheet which may be made of Mylar (a trademark of the E.I. DuPont DeNemours Corporation). Dielectric sheet 70 carries a conductive pattern on the lower surface thereof. The conductive pattern includes an array of capacitor plates 71 connected in groups by means of a plurality of drive conductors 72 which terminate on a tail 73 of the dielectric sheet. Each capacitor plate 71 is connected to only a single drive conductor 72.

Reference numeral 76 identifies an additional dielectric sheet which carries conductive patterns on both the upper and lower surfaces thereof. The conductive pattern on the lower surface includes an array of capacitor plates 77 and a plurality of sense conductors 78 which connect capacitors 77 in groups, with each capacitor connected to only a single sense conductor. Sense conductors 78 terminate on a tail 79 of dielectric sheet 76. The conductive pattern on the lower surface of dielectric sheet 76 also includes a plurality of coupling capacitor plates 80, one of which is electrically connected to each of sense conductors 78.

The conductive pattern on the upper surface of dielectric sheet 76 includes a plurality of capacitor plates 81 of which individual plates overlay capacitor plates 77 to form an array of fixed value capacitors. Capacitor plates 81 are electrically isolated from one another so as to normally electrically float. Capacitor plates 71, 77 and 81 are arranged with similar patterns and spacings so that as dielectric sheets 70 and 76 are assembled the plates of individual capacitive switches are aligned as shown along an axis 82 perpendicular to the surfaces of the dielectric sheets.

The conductive pattern on the upper surface of dielectric sheet 76 also includes a common capacitor plate having a plurality of segments 84 electrically interconnected by conductors 85. Thus, all of sense conductors 78 are capacitively coupled through the capacitors formed by plates 80 and 84.

Reference numeral 86 identifies a spacer sheet having an array of apertures 87 therethrough with the same arrangement and spacing as the capacitors formed by plates 71, 77 and 81. Sheets 70, 76 and 86 are sandwiched together so that the apertures are aligned with the capacitor plates as shown along axis 82. This arrangement normally maintains plates 71 spaced from plates 81, but permits the spacing between the plates to be varied in response to force applied to sheet 70 at the locations of plates 71. The force for varying this spacing between the capacitor plates may be applied by means of an array of plungers identified in FIG. 4 by reference numeral 90 which may comprise portions of a keyboard (not shown).

In FIG. 4, the scanning drive means and scanning sense means generally described in connection with FIG. 1 are identified by reference numerals 91 and 92 respectively. The plurality of drive conductors is connected to the drive means through a connector 93 of which one portion is attached to tail 73 of sheet 70. Similarly, the plurality of sense conductors is connected to sense means 92 through a connector 94. The various layers or sheets, capacitor plates and conductors in FIG. 4 correspond to and are identified by the same reference numerals as the sheets or layers, capacitor plates and conductors in FIG. 3. Capacitor plates 71 and 81 form a variable capacitor 95 in series with a fixed capacitor 96 formed by plates 81 and 77.

Capacitor plates 80 and 84 form fixed capacitors 97 between each of conductors 78 and interconnected capacitor plates 84, thus capacitively coupling all of the sense conductors. Since all of the unaddressed sense conductors are maintained at ground potential, this arrangement effectively achieves a predetermined capacitance between the sense conductor being addressed and ground to provide for proper operation of the capacitance detector circuit.

As apparent from the foregoing description, the sense conductor to ground capacitance is provided without the need for additional discrete parts or additional manufacturing steps. A particular embodiment of the applicant's invention has been shown and described in detail for illustrative purposes. Other modifications and variations which do not depart from the applicant's contemplation and teaching will be apparent to those of ordinary skill in the art. It is not intended that coverage be limited to the disclosed embodiment, but only by the terms of the following claims.

I claim:

1. A key actuable capacitive switch membrane assembly comprising:

flexible dielectric sheet means having first and second parallel proximate portions each with first and second surfaces arranged so that the first surfaces are adjacent and the second surfaces are separated by at least the first and second portions;

first, second and third patterns of electrically conductive material on the first surface of the first portion of said sheet means, the first surface of the second portion of said sheet means and the second surface of the second portion of said sheet means respectively, portions of said first, second and third patterns being aligned in a direction perpendicular to the portions of the sheet means so as to form first, second and third plates of an array of capacitors, portions of said first and third patterns forming first and second pluralities of conductors respectively arranged in a cross point matrix, the first and second pluralities of conductors being connected to the first and third plates of the capacitors in the array so that each capacitor is connected to a unique pair of conductors, portions of the second and third patterns forming coupling capacitor means for coupling the second plurality of conductors together ; and spacer means interposed between the first surfaces of the first and second portions of said sheet means so as to normally maintain a predetermined separation between the first surfaces, said spacer means being of a design which permits the spacing of the first and second plates of capacitors in the array to be varied, whereby each capacitor has a variable capacitance between its first and second plates in series with a fixed capacitance between its second and third plates.

2. The capacitive switch membrane assembly of claim 1 further including keyboard actuator means for selectively applying force to the first portion of said sheet means at the locations of the capacitors to vary the capacitances of selected capacitors in the array.

3. The capacitive switch membrane assembly of claim 2 further including:

scanning drive means for sequentially supplying a drive signal to individual conductors of said first plurality of conductors; and scanning sense means for sequentially sensing signals on individual conductors in said second plurality of conductors to detect the actuation states of capacitors in the array.

4. Capacitive switch membrane apparatus comprising:

a first flexible sheet of dielectric material having a first electrically conductive pattern on a first surface thereof, at least a portion of the first pattern being adapted to form an array of first capacitor plates;

a second sheet of dielectric material having second and third electrically conductive patterns on first and second surfaces thereof respectively, portions of the second and third conductive patterns being adapted to form second and third arrays of capacitor plates, the plates in the first, second and third arrays being arranged in corresponding patterns, the first and third conductive patterns further forming a cross point matrix of first and second pluralities of conductors each connecting a group of capacitor plates, the second and third conductive patterns further forming a plurality of coupling capacitors, each coupling capacitor having a plate connected to a separate one of the second plurality of conductors and a plate electrically connected in common with each of the other coupling capacitors, said first and second sheets being positioned and said second and third conductive patterns being arranged so that the first surfaces of said first and second sheets are in a proximate spaced relationship and so that the capacitor plates in the arrays of the first, second and third capacitor plates are at least partially aligned to form an array of capacitors each having first, second and third plates aligned along an axis perpendicular to the first and second sheets of dielectric material; and spacer means located between the first surfaces of said first and second sheets of dielectric material so as to permit the spacing between the first and second plates of the array of capacitors to be varied, whereby each capacitor has a variable capacitance between the first and second plates in series with a fixed capacitance between the second and third plates.

5. The apparatus of claim 4 including:
scanning drive means for sequentially supplying a drive signal to individual conductors of the first plurality of conductors; and
scanning sense means for sequentially sensing signals on individual conductors of the second plurality of conductors to detect the state of individual capacitors in the array of capacitors.

6. The apparatus of claim 5 further including key actuation means for selectively varying the capacitances of the variable capacitors in the array of capacitors.

7. Capacitive keyboard apparatus comprising:
drive means a plurality of output terminals at which drive signals are produced in a predetermined sequence;
capacitance detector means having a plurality of input terminals and operable to sequentially detect whether the capacitances of variable capacitors individually connected to the input terminals exceed a reference capacitance, the operation of said capacitance detector means requiring capacitance within a predetermined range of capacitances between the input terminal at which capacitance is being sensed and a source of reference potential of said detector means, said detector means being operable to maintain each of the input terminals at the reference potential when it is not being addressed;
a first flexible dielectric sheet having a first electrically conductive pattern on a first surface thereof, the first electrically conductive pattern including an array of first capacitor plates and a first plurality of conductors connecting the first capacitor plates in groups, each first capacitor plate being part of a single group;
means for electrically connecting the output terminals of said drive means to said first plurality of conductors so that each output terminal is connected only to a separate one of the conductors;
a second dielectric sheet having first and second surfaces thereon;
a spacer layer located between the first surfaces of said first and second sheets, said spacer layer being adapted to permit the spacing between the first surfaces of the first and second dielectric sheets to be varied at the locations of the capacitor plates in the array of first capacitor plates;
a second electrically conductive pattern on the second surface of the second dielectric sheet, the second conductive pattern including an array of second capacitor plates and a plurality of second conductors connecting the second capacitor plates in groups such that each second capacitor plate is part of a single group, the array of second capacitor plates being arranged so that each second capacitor plate is aligned with a first capacitor plate in a direction perpendicular to the surfaces of said first and second dielectric sheets, each of the second plurality of conductors having a coupling capacitor plates electrically connected thereto, the coupling capacitor plates being laterally separated from capacitor plates in the arrays of first and second capacitor plates, the plurality of second conductors being connected to the plurality of input terminals of said capacitance detector means so that each second conductor is connected only to a separate input terminal of said capacitance detector means; and
a third electrically conductive pattern on the first surface of said second dielectric sheet, the third conductive pattern including an array of third capacitor plates of which a third capacitor plate is aligned with each first capacitor plate in a direction perpendicular to the surfaces of said first and second dielectric sheets, the third conductive pattern further including coupling capacitor plate means of which portions overlay the coupling capacitor plates connected to the plurality of second conductors, whereby the capacitance between the input terminals and ground required for proper operation of said capacitance detector means is provided through the coupling capacitor plate connected to the one of the second plurality of conductors being addressed through the coupling capacitor plate means on the first surface of the second dielectric sheet and through the coupling capacitor plates connected to the unaddressed conductors of the second plurality of conductors.

* * * * *